US010134418B2

(12) United States Patent
Yamamoto et al.

(10) Patent No.: US 10,134,418 B2
(45) Date of Patent: Nov. 20, 2018

(54) FREQUENCY BAND EXTENSION APPARATUS, FREQUENCY BAND EXTENSION METHOD, AND PROGRAM

(71) Applicant: Sony Corporation, Tokyo (JP)

(72) Inventors: Yuki Yamamoto, Tokyo (JP); Toru Chinen, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 276 days.

(21) Appl. No.: 14/412,037

(22) PCT Filed: Jul. 12, 2013

(86) PCT No.: PCT/JP2013/069111
§ 371 (c)(1),
(2) Date: Dec. 30, 2014

(87) PCT Pub. No.: WO2014/017315
PCT Pub. Date: Jan. 30, 2014

(65) Prior Publication Data
US 2015/0170669 A1 Jun. 18, 2015

(30) Foreign Application Priority Data
Jul. 27, 2012 (JP) ................................ 2012-166709

(51) Int. Cl.
*H03G 5/00* (2006.01)
*G10L 21/0388* (2013.01)
*G10L 25/18* (2013.01)

(52) U.S. Cl.
CPC .......... *G10L 21/0388* (2013.01); *G10L 25/18* (2013.01)

(58) Field of Classification Search
CPC .......................... G10L 21/038; G10L 21/0388
See application file for complete search history.

(56) References Cited

U.S. PATENT DOCUMENTS

2003/0108108 A1 * 6/2003 Katayama ................ G10H 1/02
375/245

FOREIGN PATENT DOCUMENTS

| | | |
|---|---|---|
| JP | 08-123484 | 5/1996 |
| JP | 2007-017908 | 1/2007 |
| JP | 2008-139844 | 6/2008 |
| JP | 2010-079275 | 4/2010 |

* cited by examiner

*Primary Examiner* — Duc Nguyen
*Assistant Examiner* — Kile Blair
(74) *Attorney, Agent, or Firm* — Paratus Law Group, PLLC

(57) ABSTRACT

The present technique relates to a frequency band extension apparatus, a frequency band extension method, and a program which are configured to more easily obtain a high quality sound signal. An input signal may be divided into sub-band signals of a plurality of sub-bands, powers of high frequency sub-bands of the input signal may be estimated based on feature values extracted from the input signal to obtain high frequency sub-band power estimation values, the high frequency sub-band powers obtained from the sub-band signals of high-frequency sub-bands of the input signal may be compared with the high frequency sub-band power estimation values, and a high-frequency signal of the input signal may be generated based on a result of the comparison and the sub-band signals.

10 Claims, 5 Drawing Sheets

FREQUENCY BAND EXTENSION APPARATUS, FREQUENCY BAND EXTENSION METHOD, AND PROGRAM

CROSS REFERENCE TO PRIOR APPLICATION

This application is a National Stage Patent Application of PCT International Patent Application No. PCT/JP2013/069111 (filed on Jul. 12, 2013) under 35 U.S.C. § 371, which claims priority to Japanese Patent Application No. 2012-166709 (filed on Jul. 27, 2012), which are all hereby incorporated by reference in their entirety.

TECHNICAL FIELD

The present technique relates to a frequency band extension apparatus, a frequency band extension method, and a program, and particularly relates to a frequency band extension apparatus, a frequency band extension method, and a program which are configured to more easily obtain a high quality sound signal.

BACKGROUND ART

In recent years, music distribution services for distributing music data via the Internet or the like have come to be widely used. In such music distribution services, encoded data obtained by encoding music signals are distributed as music data, but when the music signals are encoded, the bit rate of the music data is kept low to reduce a download time.

Generally, in the music data having a low bit rate, signals in a high frequency band which is difficult to hear with human ears are often cut to reduce data size. For this reason, even if the music data is decoded and regenerated, real impression given by original signals is lost, and sound is muffled. That is, high quality sound cannot be obtained.

Therefore, a technique has been provided which determines an extension start band according to side information of an input signal, divides the input signal into a plurality of sub-band signals, and extends a frequency band based on sub-band signals on a lower frequency side than the extension start band (e.g., see Patent Document 1). In this technique, a component of a high frequency band can be added to the input signal, and sound quality is improved.

CITATION LIST

Patent Document

Patent Document 1: Japanese Patent Application Laid-Open No. 2008-139844

SUMMARY OF THE INVENTION

Problems to be Solved by the Invention

However, it is difficult to obtain a sufficiently high-quality sound signal more easily using the technique having been described above.

For example, a method for determining an extension start band according to side information needs to determine the extension start band for each input signal, and processing is therefore complicated. Further, in this method, even if an actual input signal includes a frequency component on the higher frequency side than the extension start band, the frequency component on the higher frequency side is not taken into consideration. Therefore, a high-frequency power is lost, and sound quality may be often deteriorated.

The present technique is made in view of such circumstances, and it is an object of the present technique to obtain a high quality sound signal further easily.

Solutions to Problems

According to one aspect of the present technique, a frequency band extension apparatus includes a signal dividing unit configured to divide an input signal into sub-band signals of a plurality of sub-bands, a high frequency sub-band power estimation unit configured to estimate powers of high frequency sub-bands of the input signal based on feature values extracted from the input signal to obtain high frequency sub-band power estimation values, a comparison unit configured to compare the high frequency sub-band powers obtained from the sub-band signals of the high-frequency sub-bands of the input signal, and the high frequency sub-band power estimation values, and a high-frequency signal generation unit configured to generate a high-frequency signal of the input signal based on a result of the comparison and the sub-band signals.

The frequency band extension apparatus may include a generation unit configured to generate an output signal based on a low-frequency signal and the high-frequency signal of the input signal.

The high-frequency signal generation unit may generate the high-frequency signal based on the sub-band signal and a larger one of the high frequency sub-band power and the high frequency sub-band power estimation value of the same sub-band.

The high-frequency signal generation unit may generate the high-frequency signal based on the result of the comparison, and the sub-band signals of low frequency sub-bands of the input signal.

The frequency band extension apparatus may further include a feature value calculation unit configured to calculate low frequency sub-band powers of the sub-band signals of the low frequency sub-bands of the input signal as the feature values.

The high frequency sub-band power estimation unit may calculate the high frequency sub-band power estimation values by linearly combining the low frequency sub-band powers, using a prepared coefficient.

According to one aspect of the present technique, a frequency band extension method or a program includes the steps of dividing an input signal into sub-band signals of a plurality of sub-bands, estimating powers of high frequency sub-bands of the input signal based on feature values extracted from the input signal to obtain high frequency sub-band power estimation values, comparing the high frequency sub-band powers obtained from the sub-band signals of high-frequency sub-bands of the input signal, and the high frequency sub-band power estimation values, and generating a high-frequency signal of the input signal based on a result of the comparison and the sub-band signals.

According to one aspect of the present technique, an input signal is divided into sub-band signals of a plurality of sub-bands, powers of high frequency sub-bands of the input signal are estimated based on feature values extracted from the input signal to obtain high frequency sub-band power estimation values, the high frequency sub-band powers obtained from the sub-band signals of high-frequency sub-bands of the input signal is compared with the high frequency sub-band power estimation values, and a high-frequency signal of the input signal is generated based on a result of the comparison and the sub-band signals.

Effect of the Invention

According to one aspect of the present technique, a high quality sound signal can be obtained more easily.

MODE FOR CARRYING OUT THE INVENTION

An embodiment according to the present technique will be described below with reference to the drawings.

First Embodiment

[Summary of the Present Technique]

First, the summary of the present technique will be described.

The present technique cuts signal components in high frequency bands equal to or higher than approximately 15 kHz which is difficult to hear with human ears, of for example sound signals such as music signals, and extends a frequency band of sound data obtained by encoding the remaining signal components in low frequency bands. More specifically, the present technique decodes the encoded sound data, estimates and generates a high frequency component of the decoded sound signal consisting of the low-frequency component, and extends the frequency band of the sound signal.

Figure 1:
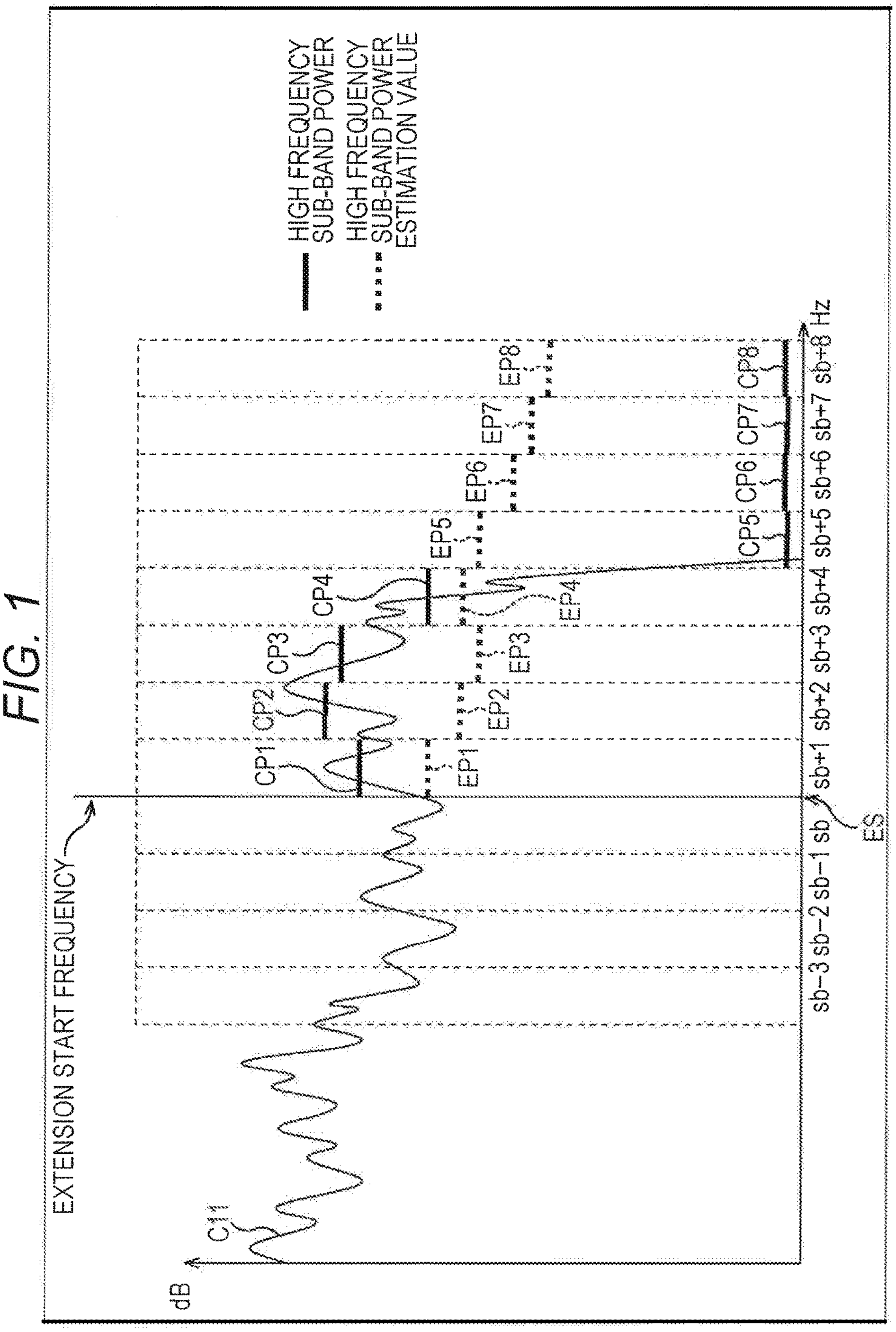
FIG. 1 is a graph illustrating generation of a high-frequency signal and loss of high-frequency power.

For example, an input signal of FIG. 1 is input as the sound signal obtained by decoding the sound data. In FIG. 1, a vertical axis represents each frequency power of the input signal, and a horizontal axis represents each frequency of the input signal. A curve C11 represents a power of each frequency component of the input signal.

In an example of FIG. 1, as can be seen from the curve C11, the input signal does not include the frequency components equal to or higher than a predetermined frequency on the higher frequency side.

Then, it is assumed that a frequency ES is defined as an extension start frequency, the frequency components of the input signal, equal to or higher than the extension start frequency, are generated by estimation, and the estimated frequency components (hereinafter referred to as high frequency components) are added to the input signal to extend the frequency band of the input signal.

It is noted that, in the following, the frequency band equal to or higher than the extension start frequency ES is referred to as high frequency, and the frequency band lower than the extension start frequency ES is referred to as low frequency. In addition, it is noted that the low-frequency component of the input signal is also referred to as a low-frequency signal, and the estimated high frequency component of the input signal is also referred to as a high-frequency signal.

When the input signal having a frequency waveform expressed by the curve C11 is input, first, the input signal is divided into sub-band signals of a plurality of the frequency bands (hereinafter referred to as sub-bands) within a predetermined bandwidth. In FIG. 1, a vertical dotted line represents a boundary position of each sub-band. In this example, the frequency band of the low-frequency component on the higher frequency side, and the high frequency component of the input signal, are divided into sub-bands sb−3 to sb+8, respectively.

Here, the sub-bands sb−3 to sb continuously arranged represent sub-bands on the lower frequency side of the input signal, and the boundary position located on the higher frequency side of the sub-band sb having the highest frequency is defined as the extension start frequency ES. Further, the sub-bands sb+1 to sb+8 continuously arranged represent sub-bands on the higher frequency side of the input signal, and the boundary position on the lower frequency side of the sub-band sb+1 having the lowest frequency is defined as the extension start frequency ES.

When the frequency band of the input signal is divided into the sub-bands, a power of each sub-band on the higher frequency side is estimated based on a feature value obtained from the input signal. Here, when the power of each high frequency sub-band, obtained by the estimation, is referred to as a high frequency sub-band power estimation value, the high frequency sub-band power estimation value represents an estimation value of a power of the high frequency component included in an original input signal, or an unencoded sound signal.

In the example of FIG. 1, straight lines EP1 to EP8 represent the high frequency sub-band power estimation values of the high-frequency sub-bands sb+1 to sb+8.

When the high frequency sub-band power estimation values EP1 to EP8 of the sub-bands sb+1 to sb+8 are used, a high-frequency signal of the input signal can be estimated. The obtained high-frequency signal and the low-frequency signal of the input signal are synthesized with each other, and the sound signal (hereinafter referred to as output signal) to which the high frequency component is added can be obtained.

Thus obtained output signal includes a high frequency component not included in the input signal, and provides a sound signal having a higher quality compared with that of the input signal.

In the example of FIG. 1, the input signal represented by the curve C11 also includes the frequency components on the higher frequency side than the extension start frequency ES, but these high frequency components are removed without being used for generation of the output signal. Therefore, when the sub-band power on the higher frequency side of an actual input signal is larger than the high frequency sub-band power estimation value, high-frequency power of the output signal is lost, and sound quality may be deteriorated compared to that of the input signal.

In FIG. 1, straight lines CP1 to CP8 represent the powers (hereinafter referred to as high frequency sub-band powers) of the sub-bands sb+1 to sb+8 on the higher frequency side of the input signal.

In this example, in the sub-bands sb+1 to sb+4 on the higher frequency side, the high frequency sub-band power has a value larger than that of the high frequency sub-band power estimation value. However, in the sub-bands sb+5 to sb+8, the high frequency sub-band power estimation value has a value larger than that of the high frequency sub-band power.

Accordingly, when the output signal is generated, the high frequency sub-band power is used to generate the high-frequency signal, for the sub-band having the high frequency sub-band power larger than the high frequency sub-band power estimation value. Therefore, the high-frequency power of the output signal is not lost, and thus the output signal having a higher quality (higher sound quality) can be obtained.

In the present technique, for each sub-band on the higher frequency side, the high frequency sub-band power estimation value and the high frequency sub-band power are compared with each other, and a larger one of them is used to generate the output signal so that the sound signal having the higher quality can be obtained.

[Exemplary Configuration of Frequency Band Extension Apparatus]

Next, a specific embodiment applied with the present technique will be described.

Figure 2:
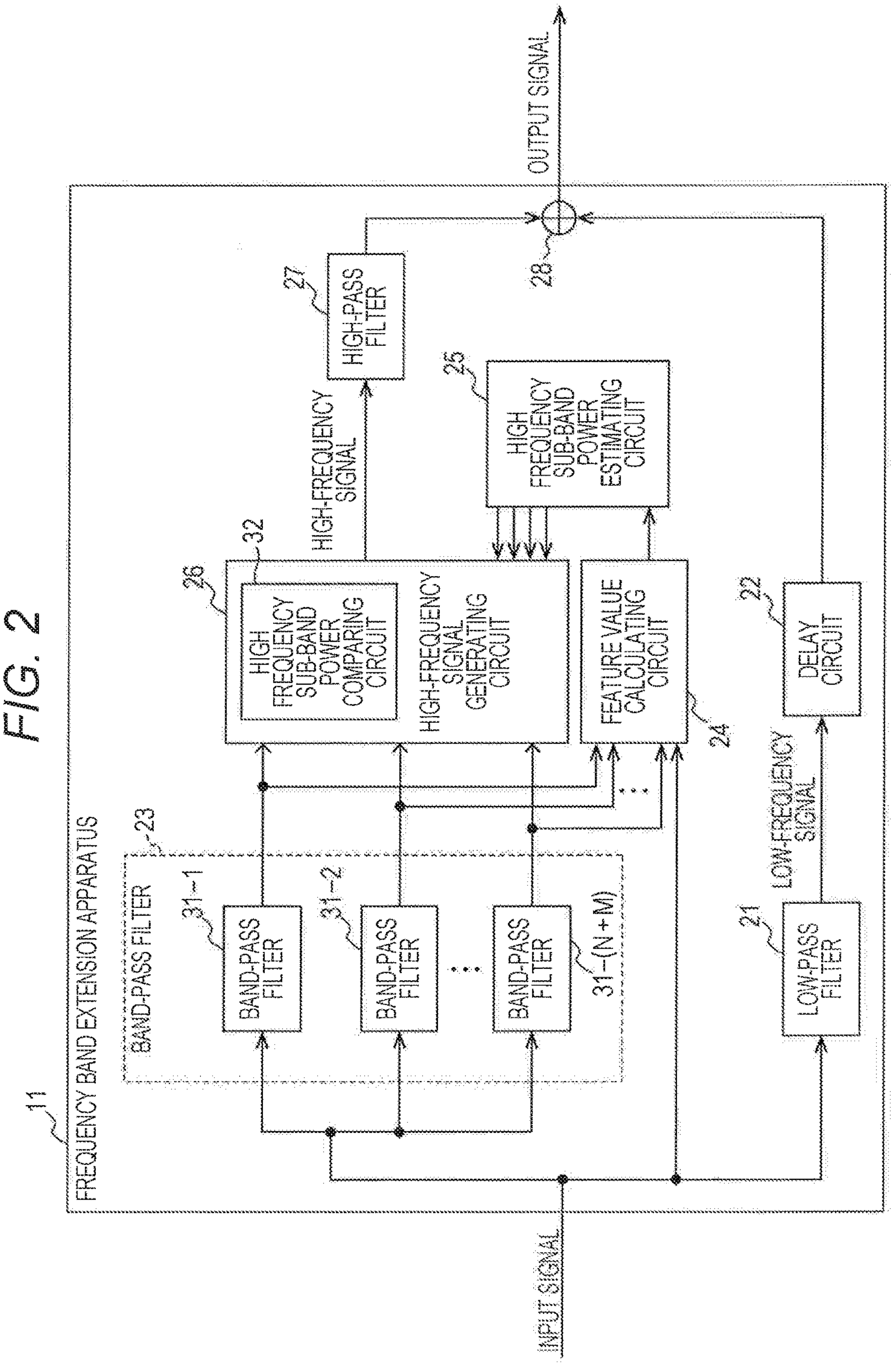
FIG. 2 is a diagram illustrating an exemplary configuration of a frequency band extension apparatus.

FIG. 2 is a diagram illustrating an exemplary configuration of the frequency band extension apparatus applied with the present technique according to one embodiment. The frequency band extension apparatus 11 inputs the input signal as the sound signal, converts the input signal to the output signal added with the high frequency component, and outputs the output signal.

The frequency band extension apparatus 11 includes a low-pass filter 21, a delay circuit 22, a band-pass filter 23, a feature value calculating circuit 24, a high frequency sub-band power estimating circuit 25, a high-frequency signal generating circuit 26, a high-pass filter 27, and a signal adder 28.

The low-pass filter 21 filters the input signal supplied, with a predetermined cutoff frequency, and supplies the obtained low-frequency signal as a low frequency signal component to the delay circuit 22.

For synchronization of the low-frequency signal from the low-pass filter 21, and the high-frequency signal to be generated, when they are added, the delay circuit 22 delays the low-frequency signal by a certain delay time, and supplies the delayed low frequency signal to the signal adder 28.

The band-pass filter 23 filters the supplied input signal, with band-pass filters each configured to pass a predetermined band, and supplies the obtained sub-band signal of each sub-band to the feature value calculating circuit 24 and the high-frequency signal generating circuit 26. That is, the band-pass filter 23 divides the input signal into the sub-band signals of respective sub-bands by filtering the input signal.

The band-pass filter 23 includes the band-pass filters 31-1 to 31-(N+M) each having a different pass band.

The band-pass filters 31-1 to 31-N pass N sub-band components on the lower frequency side than the extension start frequency of the input signal, and supply the obtained sub-band signals to the feature value calculating circuit 24 and the high-frequency signal generating circuit 26. That is, the band-pass filter 31-i (wherein, $1 \le i \le N$) passes a frequency band component of the i-th sub-band on the lower frequency side from the extension start frequency of the input signal, and generates the sub-band signal of a sub-band sb−(i−1).

It is noted that the band-pass filters 31-1 to 31-N generate the sub-band signals of the sub-bands on the lower frequency side, and hereinafter, the sub-band signals will be also referred to as low frequency sub-band signals.

Further, the band-pass filters 31-(N+1) to 31-(N+M) pass M sub-band components on the higher frequency side than the extension start frequency of the input signal, and supply the obtained sub-band signals to the feature value calculating circuit 24 and the high-frequency signal generating circuit 26. That is, the band-pass filter 31-i (wherein, $N+1 \le i \le N+M$) passes a frequency band component of the (i−N)-th sub-band on the higher frequency side from the extension start frequency of the input signal, and generates a sub-band signal of a sub-band sb+(i−N).

It is noted that the band-pass filters 31-(N+1) to 31-(N+M) generate the sub-band signals of the sub-bands on the higher frequency side, and hereinafter, the sub-band signals will be also referred to as high frequency sub-band signals. Further, when the band-pass filters 31-1 to 31-(N+M) do not need to be particularly distinguished between them, hereinafter, the band-pass filters will be simply referred to as the band-pass filter 31.

The feature value calculating circuit 24 calculates one or more feature values, using at least one of the supplied input signal and the plurality of sub-band signals having been supplied from the band-pass filter 23, and supplies the calculated feature values to the high frequency sub-band power estimating circuit 25. Here, the feature value is information representing signal features of the input signal.

The high frequency sub-band power estimating circuit 25 calculates the high frequency sub-band power estimation value, based on the one or more feature values having been supplied from the feature value calculating circuit 24, and supplies the calculated high frequency sub-band power estimation value to the high-frequency signal generating circuit 26.

The high-frequency signal generating circuit 26 generates the high-frequency signal, based on the plurality of sub-band signals having been supplied from the band-pass filter 23, and a plurality of the high frequency sub-band power estimation values having been supplied from the high frequency sub-band power estimating circuit 25, and supplies the generated high-frequency signal to the high-pass filter 27.

The high-frequency signal generating circuit 26 includes a high frequency sub-band power comparing circuit 32.

The high frequency sub-band power comparing circuit 32 calculates the high frequency sub-band power of each sub-band on the higher frequency side, based on each high frequency sub-band signal having been supplied from the band-pass filter 23. The high frequency sub-band power comparing circuit 32 compares the high frequency sub-band power and the high frequency sub-band power estimation value having been supplied from the high frequency sub-band power estimating circuit 25 for each sub-band, and the larger one of them is defined as a pseudo high frequency sub-band power of the sub-band.

The high-frequency signal generating circuit 26 generates the high-frequency signal as a high-frequency signal component, based on a plurality of the low frequency sub-band signals having been supplied from the band-pass filter 23, and the pseudo high frequency sub-band power of each sub-band on the higher frequency side, having been obtained by the comparison by the high frequency sub-band power comparing circuit 32.

The high-pass filter 27 filters the high-frequency signal having been supplied from the high-frequency signal generating circuit 26, with a cutoff frequency corresponding to the cutoff frequency in the low-pass filter 21, and supplies the filtered high frequency signal to the signal adder 28. That is, the high-pass filter 27 removes the low-frequency component included in the high-frequency signal, and supplies the obtained high frequency signal to the signal adder 28.

The signal adder 28 adds the low-frequency signal from the delay circuit 22 and the high-frequency signal from the high-pass filter 27, and outputs the obtained output signal.

It is noted that an example of the frequency band extension apparatus 11 in which the band-pass filters 31 pass predetermined band components of the input signal to obtain the sub-band signals, has been described, but a method for obtaining the sub-band signals may employ any method using a band dividing filter or the like. An example of the frequency band extension apparatus 11 has been described above in which the high-frequency signal and the low-frequency signal are added to generate the output signal, but a method for obtaining the output signal by synthesizing the high frequency component and the low-frequency component may employ any method using a band synthesis filter or the like.

[Description of Frequency Band Extension Processing]

Next, operation of the frequency band extension apparatus 11 will be described.

Figure 3:
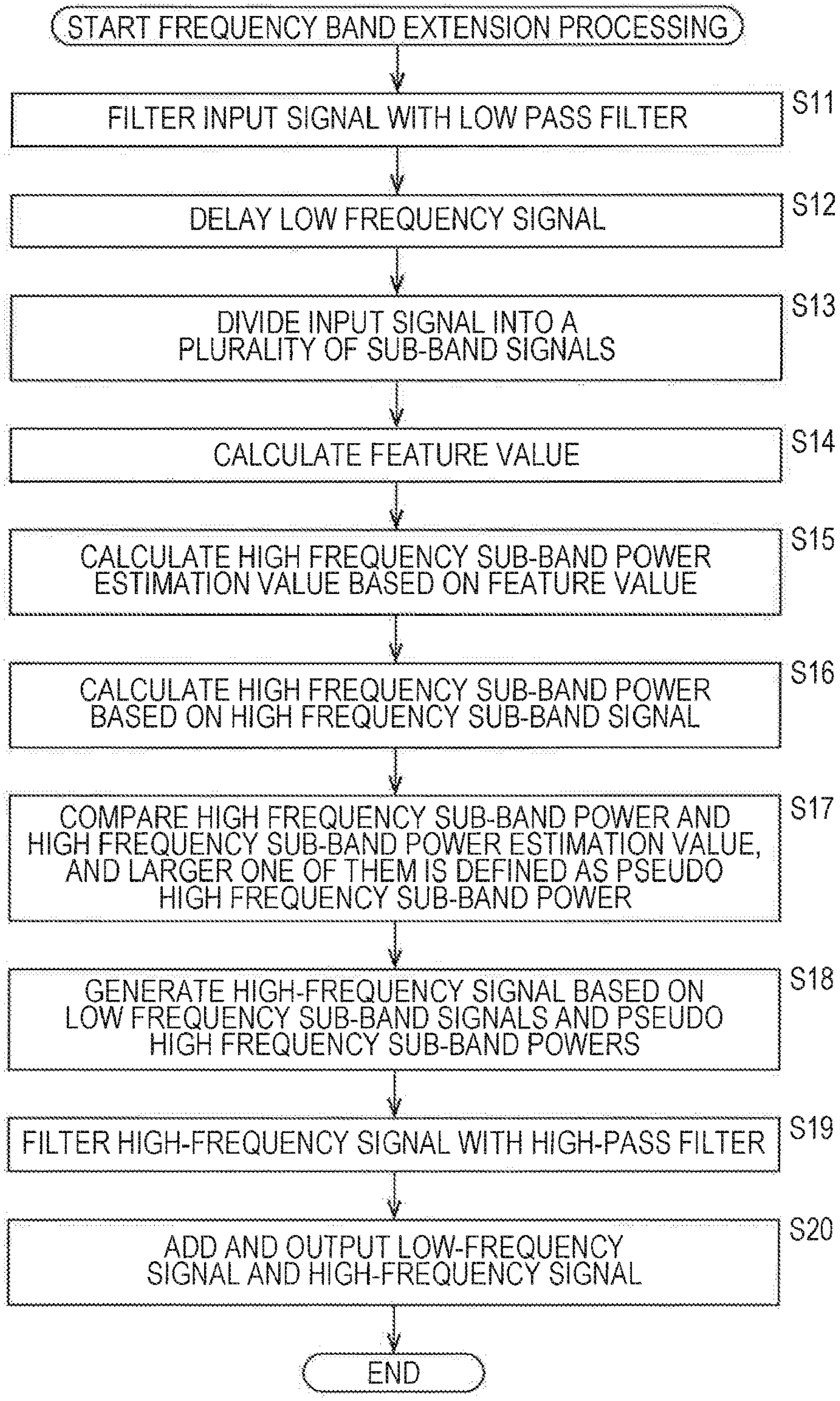
FIG. 3 is a flowchart illustrating frequency band extension processing.

When the input signal is supplied and generation of the output signal is instructed, the frequency band extension apparatus 11 performs frequency band extension processing to generate and output the output signal added with the high frequency component. The frequency band extension processing by the frequency band extension apparatus 11 will be described below with reference to a flowchart of FIG. 3.

In step S11, the low-pass filter 21 filters the supplied input signal with a low-pass filter having the predetermined cutoff frequency, and supplies the obtained low-frequency signal to the delay circuit 22.

The low-pass filter 21 can have any set frequency as the cutoff frequency, but the predetermined frequency is set as the extension start frequency, and the extension start frequency is set as the cutoff frequency. Accordingly, the low-pass filter 21 supplies, as the low-frequency signal, a signal having the frequency component lower than the extension start frequency to the delay circuit 22.

In step S12, the delay circuit 22 delays the low-frequency signal from the low-pass filter 21 by the certain delay time, and supplies the delayed low frequency signal to the signal adder 28.

In step S13, the band-pass filter 23 divides the supplied input signal into a plurality of sub-band signals, and supplies the divided sub-band signals to the feature value calculating circuit 24 and the high-frequency signal generating circuit 26.

That is, the band-pass filters 31-1 to 31-N pass the signal components of predetermined pass bands on the lower frequency side than the extension start frequency, of the input signal, and supply, as one of the plurality of low frequency sub-band signals, the signal components to the feature value calculating circuit 24 and the high-frequency signal generating circuit 26.

Further, the band-pass filters 31-(N+1) to 33-(N+M) pass the signal components of predetermined pass bands on the higher frequency side than the extension start frequency, of the input signal, and supply, as one of a plurality of high frequency sub-band signals, the signal components to the feature value calculating circuit 24 and the high-frequency signal generating circuit 26.

Here, processing by the band-pass filter 23 will be described. It should be assumed that, for ease of description, the number of band-pass filters 31 on the lower frequency side than the extension start frequency is N=4, and the number of band-pass filters 31 on the higher frequency side than the extension start frequency is M=8, in the following description.

For example, one of 16 sub-bands obtained by equally dividing the Nyquist frequency of the input signal into 16 frequency bands is defined as an extension start band, and a frequency at a lower end of the extension start band is defined as the extension start frequency.

Out of the 16 sub-bands obtained by equally dividing the Nyquist frequency into 16 frequency bands, four sub-bands on the lower frequency side than the extension start frequency are defined as the pass bands of the band-pass filters 31-1 to 31-4, respectively. Further, out of the 16 sub-bands, eight sub-bands on the higher frequency side than the extension start frequency are defined as the pass bands of the band-pass filters 31-5 to 31-12, respectively.

FIG. 1 illustrates the position of the pass bands of the band-pass filters 31-1 to 31-12 on a frequency axis.

As illustrated in FIG. 1, an index of the first sub-band from the higher frequency side of the frequency bands (sub-bands) on the lower frequency side than the extension start frequency is defined as sb, an index of the second sub-band is defined as sb−1, and an index of the I-th sub-band is defined as sb−(I−1). In this configuration, the sub-bands having the indexes of sb to sb−3, of the sub-bands on the lower frequency side than the extension start frequency, are assigned to the band-pass filters 31-1 to 31-4, respectively, as the pass bands.

Further, the sub-bands having the indexes of sb+1 to sb+8, of the sub-bands on the higher frequency side than the extension start frequency, are assigned to the band-pass filters 31-5 to 31-12, respectively, as the pass bands.

It is noted that, in the present embodiment, an example has been described in which the pass bands of the band-pass filters 31-1 to 31-1.2 are assigned respectively to the predetermined 12 sub-bands of the 16 sub-bands obtained by equally dividing the Nyquist frequency of the input signal into 16 frequency bands. However, the present technique is not limited to this example, and, for example, the predetermined 12 sub-bands of 256 sub-bands obtained by dividing the Nyquist frequency of the input signal into 256 equal parts, may be defined as the pass bands of the band-pass filters 31, respectively. In addition, the pass bands of the band-pass filters 31 may have bandwidths different from each other.

In step S14, the feature value calculating circuit 24 calculates the feature value, using at least one of the supplied input signal and the plurality of sub-band signals having been supplied from the band-pass filter 23, and supplies the calculated feature value to the high frequency sub-band power estimating circuit 25.

For example, the feature value calculating circuit 24 calculates, as the feature value, a power of the sub-band signal (hereinafter also referred to as low frequency sub-band power) for each sub-band, based on four low frequency sub-band signals from the band-pass filter 23, and supplies the calculated power to the high frequency sub-band power estimating circuit 25.

Specifically, the feature value calculating circuit 24 derives the low frequency sub-band power, power (ib, J), in a predetermined time frame J, from the four low frequency sub-band signals x(ib, n) supplied from the band-pass filter 23, using the following formula (1). Here, ib represents a sub-band index, and n represents a discrete time index. It is noted that the number of samples in one frame of the low frequency sub-band signal is FSIZE, and the power is expressed in decibel units.

[Mathematical Formula 1]

$$\mathrm{power}(ib, J) = 10\ \log 10\left\{\left(\sum_{n=J*FSIZE}^{(J+1)FSIZE-1} \times (ib, n)^2\right)/FSIZE\right\}\ (sb-3 \le ib \le sb) \tag{1}$$

As described above, the low frequency sub-band power, power(ib, J), having been obtained by the feature value calculating circuit 24 is supplied, as the feature value, to the high frequency sub-band power estimating circuit 25.

It is noted that an example has been described in which the low frequency sub-band power is calculated as the feature value, but the feature value is not limited to the low frequency sub-band power, and any feature value may be employed. For example, a frequency centroid representing an inclination degree of a frequency waveform within a certain time, or time variation of the low frequency sub-band power may be calculated as the feature value.

In step S15, the high frequency sub-band power estimating circuit 25 calculates the high frequency sub-band power estimation value based on the feature value having been supplied from the feature value calculating circuit 24, and supplies the calculated estimation value to the high-frequency signal generating circuit 26.

For example, the high frequency sub-band power estimating circuit 25 calculates the high frequency sub-band power estimation values of the sub-bands sb+1 to sb+8 on the higher frequency side, based on the low frequency sub-band powers of the four sub-bands, supplied as the feature values from the feature value calculating circuit 24.

Specifically, the high frequency sub-band power estimating circuit 25 calculates the following formula (2) to obtain the high frequency sub-band power estimation value, $power_{est}$(ib, J), of the sub-band having an index of ib, based on the low frequency sub-band power, power (kb, J) (wherein, sb−3≤kb≤sb).

[Mathematical Formula 2]

$$power_{est}(ib, J) = \left(\sum_{kb=sb-3}^{sb} \{A_{ib}(kb)\mathrm{power}(kb, J)\}\right) + B_{ib}(sb+1 \le ib \le sb+8) \tag{2}$$

It is noted that, in formula (2), a coefficient $A_{ib}$(kb) and a coefficient $B_{ib}$ are coefficients having different values for each sub-band ib, and the coefficient $A_{ib}$(kb) and the coefficient $B_{ib}$ are previously derived by learning or the like to obtain preferable values for various input signals.

The high frequency sub-band power estimating circuit 25 linearly combines the low frequency sub-band powers of the low frequency sub-bands, using the coefficient, to calculate the high frequency sub-band power estimation values of the high frequency sub-bands, and supplies the calculated high frequency sub-band power estimation values to the high-frequency signal generating circuit 26.

It is noted that, here, an example has been described in which the high frequency sub-band power estimation values are calculated by linear combining the low frequency sub-band powers, but a method for calculating the high frequency sub-band power estimation values is not limited to this example, and any calculation method may be employed. For example, the high frequency sub-band power estimation values may be calculated by linearly combining the plurality of low frequency sub-band powers of several frames before and after the time frame J, or may calculate the estimation values using a non-linear function.

In step S16, the high frequency sub-band power comparing circuit 32 calculates the high frequency sub-band power of each sub-band on the higher frequency side, based on the high frequency sub-band signal having been supplied from the band-pass filter 23.

For example, the high frequency sub-band power comparing circuit 32 calculates the following formula (3) to obtain the high frequency sub-band power, $power_{hab}$(ib, J), in the time frame J, for each sub-band, based on eight high frequency sub-band signals x(ib, n) having been supplied from the band-pass filter 23.

[Mathematical Formula 3]

$$power_{hsb}(ib, J) = 10\ \log 10\left\{\left(\sum_{n=J*FSIZE}^{(J+1)FSIZE-1} \times (ib, n)^2\right)/FSIZE\right\}\ (sb+1 \le ib \le sb+8) \tag{3}$$

It is noted that, in formula (3), ib represents the sub-band index, and n represents the discrete time index. Further, it is noted that the number of samples in one frame of the high frequency sub-band signal is FSIZE, and the power is expressed in decibel units.

After the high frequency sub-band power of each sub-band on the higher frequency side is calculated in this way, the processing proceeds from step S16 to step S17.

In step S17, the high frequency sub-band power comparing circuit 32 compares the high frequency sub-band power and the high frequency sub-band power estimation value having been supplied from the high frequency sub-band power estimating circuit 25 for each sub-band, and the larger one is defined as the pseudo high frequency sub-band power.

For example, as illustrated in FIG. 1, in the sub-bands sb+1 to sb+4, the high frequency sub-band powers CP1 to CP4 obtained in the processing of step S16 are defined to be larger than the high frequency sub-band power estimation values EP1 to EP4.

Further, in the sub-bands sb+5 to sb+8, the high frequency sub-band power estimation values EP5 to EP8 are defined to be larger than the high frequency sub-band powers CP5 to CP8.

In such a configuration, for the sub-bands sb+1 to sb+4, the high frequency sub-band power comparing circuit 32 defines the high frequency sub-band power of each sub-band as the pseudo high frequency sub-band power of each sub-band. Further, for the sub-bands sb+5 to sb+8, the high frequency sub-band power comparing circuit 32 defines the high frequency sub-band power estimation value of each sub-band as the pseudo high frequency sub-band power of each sub-band.

Figure 4:
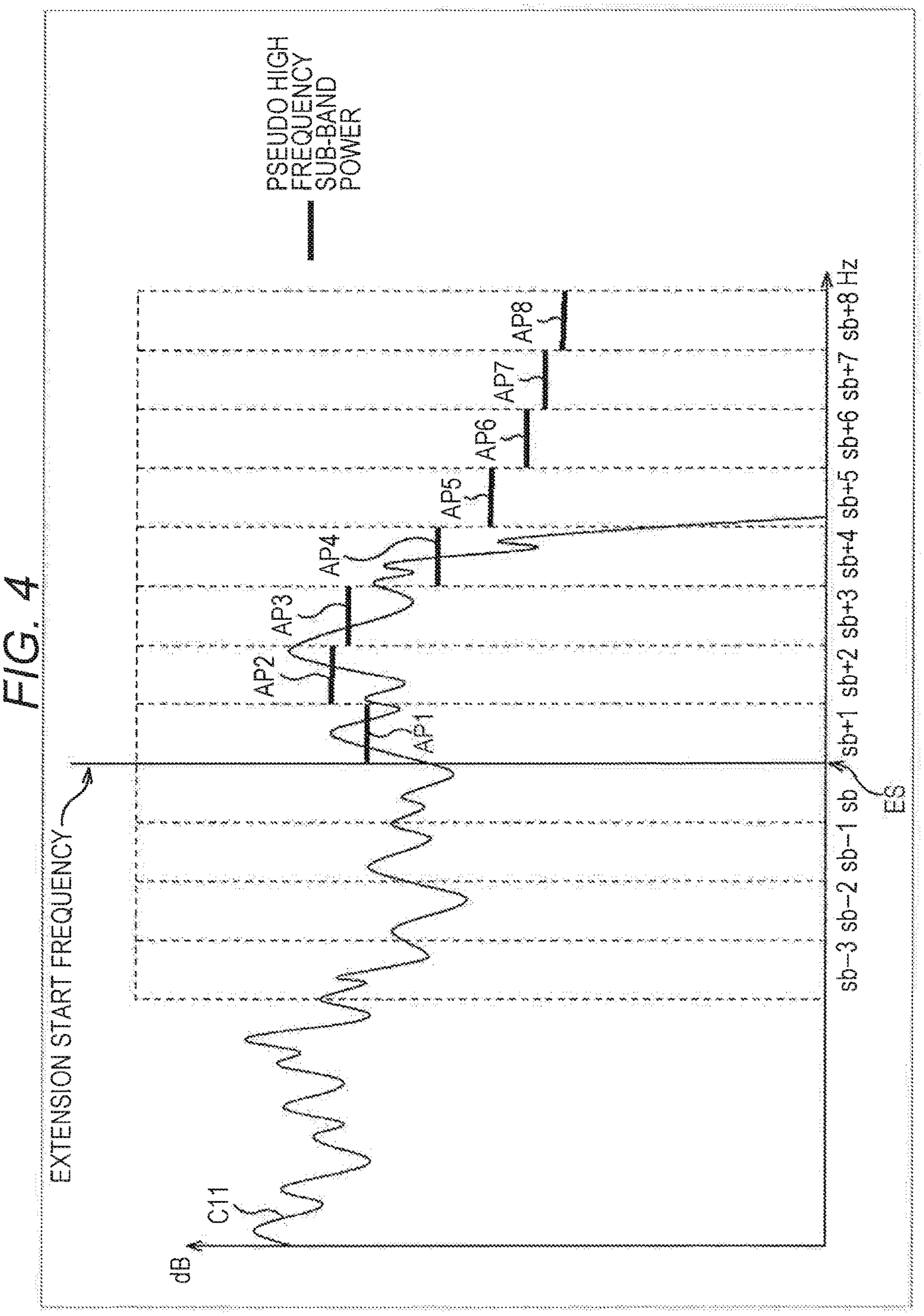
FIG. 4 is a graph illustrating a pseudo high frequency sub-band power.

Therefore, for example, the pseudo high frequency sub-band power illustrated in FIG. 4 can be obtained. It is noted that, in FIG. 4, a part corresponding to that in FIG. 1 is denoted by the same reference sign, and description thereof is omitted. In FIG. 4, a vertical axis represents each frequency power of the input signal, and a horizontal axis represents each frequency of the input signal.

In FIG. 4, solid straight lines AP1 to AP8 represent pseudo high frequency sub-band powers of the sub-bands sb+1 to sb+8 on the higher frequency side of the input signal.

In this example, the high frequency sub-band powers CP1 to CP4 of FIG. 1 are directly defined as the pseudo high frequency sub-band powers AP1 to AP4. Further, the high frequency sub-band power estimation values EP5 to EP8 of FIG. 1 are directly defined as the pseudo high frequency sub-band powers AP5 to AP8.

As described above, the high frequency sub-band power and the high frequency sub-band power estimation value are compared with each other, and the larger one is defined as the pseudo high frequency sub-band power. Accordingly, in all the high frequency sub-bands, the pseudo high frequency sub-band powers are not smaller than the high frequency sub-band powers. Therefore, loss of the high-frequency power of the output signal is prevented, and deterioration of the sound quality of the output signal is prevented relative to those of the input signal.

In step S18, the high-frequency signal generating circuit 26 generates the high-frequency signal based on the low frequency sub-band signals from the band-pass filter 23, and the pseudo high frequency sub-band powers having been obtained by the high frequency sub-band power comparing circuit 32, and supplies the high frequency signal to the high-pass filter 27. It is noted that the high-frequency signal represents a signal including a frequency component on the higher frequency side than the extension start frequency.

For example, the high-frequency signal generating circuit 26 calculates formula (1) to obtain the low frequency sub-band power, power (ib, J), of each low frequency sub-band, based on the plurality of low frequency sub-band signals having been supplied from the band-pass filter 23.

Further, the high-frequency signal generating circuit 26 calculates the following formula (4) to obtain a gain value G(ib, J), based on the calculated low frequency sub-band power, and the pseudo high frequency sub-band power, $power_{par}$(ib, J), having been obtained by the high frequency sub-band power comparing circuit 32.

[Mathematical Formula 4]

$$G(ib,J)=10^{[(power_{par}(ib,J)-power(sb_{map}(ib),J))/20]}$$

$$(sb+1\leq ib\leq sb+8) \quad (4)$$

It is noted that, in formula (4), $sb_{sap}$(ib) represents a sub-band index of a mapping source when the sub-band ib is defined as the sub-band of a mapping destination, and is expressed by the following formula (5).

[Mathematical Formula 5]

$$sb_{map}(ib)=ib-4INT\left(\frac{ib-sb-1}{4}+1\right)\ (sb+1\leq ib\leq sb+8) \quad (5)$$

It is noted that, in formula (5), INT(a) is a function for truncating the decimal point of a value a.

Next, the high-frequency signal generating circuit 26 calculates, with the following formula (6), a gain-controlled sub-band signal x2(ib, n) by multiplying the low frequency sub-band signal, $x(sb_{map}(ib), n)$ from the band-pass filter 23, by the gain value G(ib, J) obtained from formula (4).

[Mathematical Formula 6]

$$x2(ib,n)=G(ib,J)\times(sb_{map}(ib),n)$$

$$(J*FSIZE\leq n\leq(J+1)FSIZE-1,sb+1\leq ib\leq sb+8) \quad (6)$$

Further, the high-frequency signal generating circuit 26 calculates the following formula (7) to cosine-modulate a frequency corresponding to the frequency at the lower end of the low frequency sub-band sb−3 to a frequency corresponding to an upper end of the sub-band sb, and to cosine-transform the gain-controlled sub-band signal x2(ib, n) to a gain-controlled sub-band signal x3(ib, n).

[Mathematical Formula 7]

$$x3(ib,n)=x2(ib,n)*2\cos(n)*[4(ib+1)\pi/32]$$

$$(sb+1\leq ib\leq sb+8) \quad (7)$$

It is noted that, in the formula (7), π represents a circular constant. The formula (7) means that each gain-controlled sub-band signal x2(ib, n) is shifted to a frequency on the higher frequency side by four bands.

The high-frequency signal generating circuit 26 calculates the following formula (8) to obtain the high-frequency signal $x_{high}$(n) from the gain-controlled sub-band signal x3(ib, n) having been shifted to the high frequency side.

[Mathematical Formula 8]

$$x_{high}(n)=\sum_{ib=sb+1}^{sb+8}\times 3(ib,n) \quad (8)$$

That is, according to a ratio between the low frequency sub-band power and the pseudo high frequency sub-band power, the low frequency sub-band signal $x(sb_{map}(ib), n)$ is amplitude-modulated, and the obtained sub-band signal x2(ib, n) is further frequency-modulated. Therefore, a signal having the frequency component of the sub-band on the lower frequency side is converted to a signal having the frequency component of the sub-band on the higher frequency side, and the high frequency sub-band signal x3(ib, n) is obtained. The sum of the high frequency sub-band signals is defined as the high-frequency signal.

Processing of obtaining the sub-band signal of each sub-band on the higher frequency side, as described above, is processing as described below.

It is assumed that four sub-bands continuously arranged in a frequency domain is referred to as a band block, and the frequency band is divided to configure one band block (hereinafter particularly referred to as low frequency block) from four sub-bands sb to sb−3 on the lower frequency side.

At this time, for example, a band including four sub-bands sb+1 to sb+4 on the higher frequency side is defined as one band block. It is noted that, hereinafter, the high frequency side, or the band block including the sub-band having an index of sb+1 or higher is specifically referred to as a high frequency block.

It is now assumed that attention is paid to one sub-band constituting the high frequency block to generate the high frequency sub-band signal of the one sub-band (hereinafter referred to as sub-band of interest). First, the high-frequency signal generating circuit 26 specifies a sub-band of the low frequency block, having the same relative positional relationship in the block with the sub-band of interest in the high frequency block.

For example, when the sub-band of interest is the sub-band sb+1, the sub-band of interest is in the lowest frequency band of the high frequency block, and a sub-band of the low frequency block, having the same positional relationship with the sub-band of interest, is the sub-band sb−3.

As described above, when the sub-band of the low frequency block, having the same relative positional relationship in the block with the sub-band of interest is specified, the low frequency sub-band power and the low frequency sub-band signal, of the specified sub-band, and the pseudo high frequency sub-band power of the sub-band of interest are used to generate the high frequency sub-band signal of the sub-band of interest.

That is, the pseudo high frequency sub-band power and the low frequency sub-band power are substituted in formula (4), and the gain value is calculated according to the powers. The low frequency sub-band signal is multiplied by the calculated gain value, the low frequency sub-band signal having been multiplied by the gain value is frequency-modulated by operation of formula (7), and the high frequency sub-band signal of the sub-band of interest is obtained.

The thus obtained high frequency sub-band signals of the sub-bands on the higher frequency side are summed up to generate the high-frequency signal. When the high-frequency signal is obtained, the high-frequency signal generating circuit 26 supplies the obtained high-frequency signal to the high-pass filter 27.

In step S19, the high-pass filter 27 filters the high-frequency signal having been supplied from the high-frequency signal generating circuit 26 with a high-pass filter to remove noise such as a lower frequency alias component included in the high-frequency signal. The high-pass filter 27 supplies the high-frequency signal having been obtained by filtering to the signal adder 28.

In step S20, the signal adder 28 adds the low-frequency signal having been supplied from the delay circuit 22, and the high-frequency signal having been supplied from the high-pass filter 27, and outputs the added signals as the output signal. After the output signal is output, the frequency band extension processing ends.

As described above, the frequency band extension apparatus 11 compares an actual high frequency sub-band power of the high frequency component included in the input signal and the high frequency sub-band power estimation value estimated from the feature value extracted from the input signal with each other for each sub-band. The frequency band extension apparatus 11 generates the high-frequency signal, using the larger one of the compared high frequency sub-band power and high frequency sub-band power estimation value, as each sub-band power.

Therefore, according to the frequency band extension apparatus 11, the deterioration of the high-frequency power is inhibited by simple processing of comparing the actual high frequency sub-band power and the high frequency sub-band power estimation value with each other, and the sound signal having a higher quality can be obtained. For example, when the input signal includes a large number of frequency components on the higher frequency side than the extension start frequency, the high frequency components are effectively used, and the deterioration of the high-frequency power can be effectively inhibited.

In the present technique, for example, the extension start frequency is previously determined, and the present technique is particularly effective for reproduction of the input signals having various bandwidths, ranging from the input signal having a narrow bandwidth of the frequency component to the input signal having a wide bandwidth of the frequency component.

Incidentally, a series of processing having been described above may be performed by hardware or software. When the series of processing is performed by the software, a program constituting the software is installed on a computer. Here, the computer includes a computer incorporated into dedicated hardware, or for example a versatile personal computer for performing various functions by installing various programs.

Figure 5:
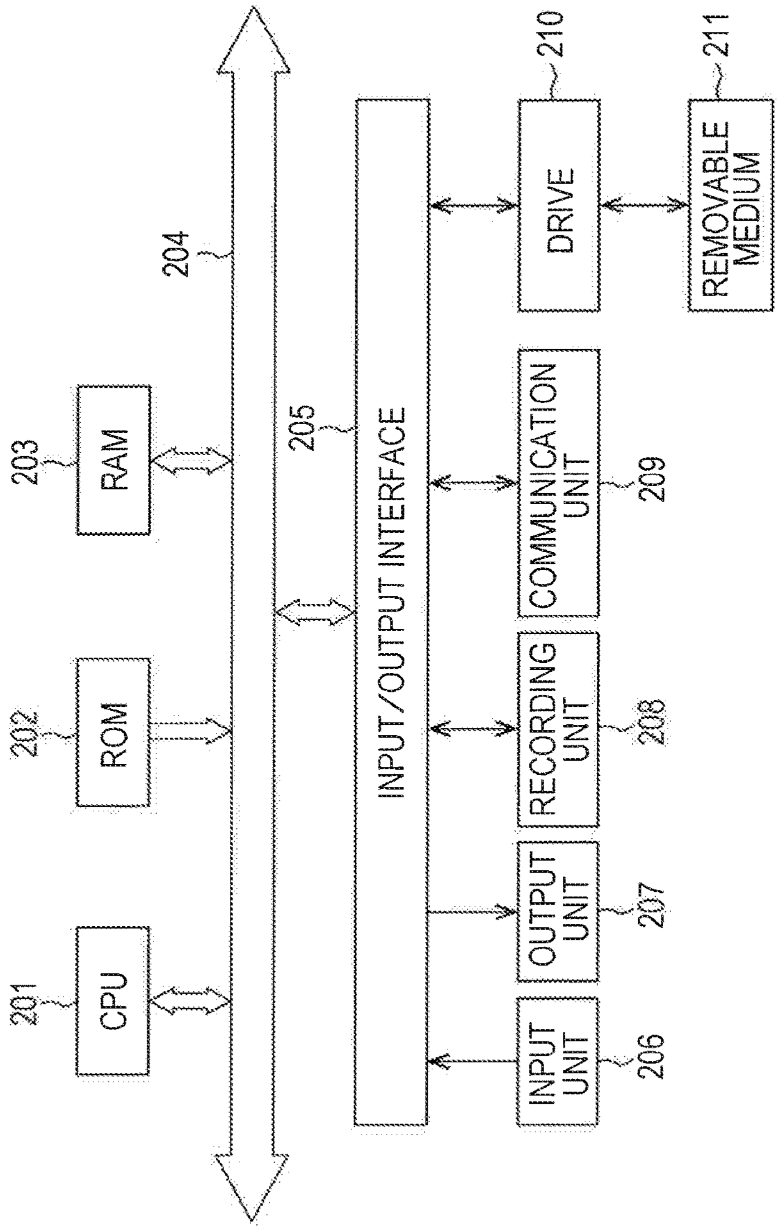
FIG. 5 is a diagram illustrating an exemplary configuration of a computer.

FIG. 5 is a block diagram illustrating an exemplary configuration of computer hardware configured to perform the series of processing having been described above by the program.

In the computer, a central processing unit (CPU) 201, a read only memory (BOM) 202, and a random access memory (RAM) 203 are connected to each other by a bus 204.

The bus 204 is further connected with an input/output interface 205. The input/output interface 205 is connected with an input unit 206, an output unit 207, a recording unit 208, a communication unit 209, and a drive 210.

The input unit 206 includes a keyboard, a mouse, a microphone, an imaging element, or the like. The output unit 207 includes a display, a speaker, or the like. The recording unit 208 includes a hard disk, a nonvolatile memory, or the like. The communication unit 209 includes a network interface or the like. The drive 210 drives a removable medium 211, such as a magnetic disk, an optical disk, a magneto-optical disk, or a semiconductor memory.

In the computer configured as described above, the CPU 201 executes for example the program recorded in the recording unit 208 by loading the program to the RAM 203 through the input/output interface 205 and the bus 204, and the series of processing having been described above is performed.

The program executed by the computer (CPU 201) can be recorded for example in the removable medium 211 as a package medium for provision. Further, the program can be provided through a wired or wireless transmission medium, such as a local area network, the Internet, or digital satellite broadcasting.

In the computer, the program can be installed in the recording unit 208 through the input/output interface 205, by mounting the removable medium 211 to the drive 210. Further, the program can be received by the communication unit 209 through the wired or wireless transmission medium, and installed in the recording unit 208. The program may be previously installed in the ROM 202 or the recording unit 208.

It is noted that the program executed by the computer may be a program for executing the processes in time series along the order having been described in the present description, or a program for executing the processes in parallel or with necessary timing, for example, when evoked.

The embodiment of the present technique is not intended to be limited to the above-mentioned embodiment, and various modifications and variations may be made without departing from the scope and spirit of the present technique.

For example, the present technique may include a cloud computing configuration for sharing one function between a plurality of apparatuses through the network.

The steps having been described in the above-mentioned flowchart can be performed by the one apparatus, and further shared between the plurality of apparatuses.

Further, when one step includes a plurality of processes, the plurality of processes of the one step may be performed by the one apparatus, and further shared between the plurality of apparatuses.

Further, the present technique may be configured as described below.

[1]

A frequency band extension apparatus including a signal dividing unit configured to divide an input signal into sub-band signals of a plurality of sub-bands, a high frequency sub-band power estimation unit configured to estimate powers of high frequency sub-bands of the input signal based on feature values extracted from the input signal to obtain high frequency sub-band power estimation values, a comparison unit configured to compare the high frequency sub-band powers obtained from the sub-band signals of the high-frequency sub-bands of the input signal, and the high frequency sub-band power estimation values, and a high-frequency signal generation unit configured to generate a high-frequency signal of the input signal based on a result of the comparison and the sub-band signals.

[2]

The frequency band extension apparatus according to [1], further including a generation unit configured to generate an output signal based on a low-frequency signal and the high-frequency signal of the input signal.

[3]

The frequency band extension apparatus according to [1] or [2], wherein the high-frequency signal generation unit generates the high-frequency signal based on the sub-band signal, and a larger one of the high frequency sub-band power and the high frequency sub-band power estimation value of the same sub-band.

[4]

The frequency band extension apparatus according to any of [1] to [3], wherein the high-frequency signal generation unit generates the high-frequency signal based on a result of the comparison, and the sub-band signals of low frequency sub-bands of the input signal.

[5]

The frequency band extension apparatus according to any of [1] to [4], further including a feature value calculation unit configured to calculate low frequency sub-band powers of the sub-band signals of the low frequency sub-bands of the input signal as the feature values.

[6]

The frequency band extension apparatus according to [5], wherein the high frequency sub-band power estimation unit calculates the high frequency sub-band power estimation values by linearly combining the low frequency sub-band powers, using a coefficient prepared.

REFERENCE SIGNS LIST

11 Frequency band extension apparatus
21 Low-pass filter
23 Band-pass filter
24 Feature value calculating circuit
25 High frequency sub-band power estimating circuit
26 High-frequency signal generating circuit
28 Signal adder
32 High frequency sub-band power comparing circuit

The invention claimed is:

1. A frequency band extension apparatus comprising:

a signal dividing unit configured to divide an input signal, having a frequency waveform including frequency components within a predetermined bandwidth, into a plurality of sub-band signals of a plurality of sub-bands within the predetermined bandwidth;

a feature value calculation unit configured to calculate, for each of the plurality of sub-bands, a low frequency sub-band power of the input signal as a feature value;

a high frequency sub-band power estimation unit configured to estimate, for each high frequency sub-band of the plurality of sub-bands, a power of a high frequency sub-band of the input signal based on the feature values to obtain high frequency sub-band power estimation values;

a comparison unit configured to compare, for each of the high frequency sub-bands, a respective high frequency sub-band power and a respective high-frequency sub-band power estimation value associated with the respective high frequency sub-band; and a high-frequency signal generation unit configured to generate a high-frequency signal of the input signal using, for each of the high frequency sub-bands, a larger result of the comparison of the respective high frequency sub-band power and the respective high-frequency sub-band power estimation value, wherein the signal dividing unit, the feature value calculation unit, the high frequency sub-band power estimation unit, the comparison unit and the high-frequency signal generation unit are each implemented via at least one processor.

2. The frequency band extension apparatus according to claim 1, further comprising:

a generation unit configured to generate an output signal based on a low-frequency signal and the high-frequency signal of the input signal, wherein the generation unit is implemented via at least one processor.

3. The frequency band extension apparatus according to claim 2, wherein the high-frequency signal generation unit generates the high-frequency signal based on the larger result of the comparison for each of the high frequency sub-bands and the sub-band signals of low frequency sub-bands of the input signal.

4. The frequency band extension apparatus according to claim 2, wherein the generation unit is further configured to generate the output signal by adding the low-frequency signal and the high-frequency signal of the input signal.

5. The frequency band extension apparatus according to claim 1, wherein the high frequency sub-band power estimation unit calculates the high frequency sub-band power estimation values by linearly combining more than one low frequency sub-band power using a predetermined coefficient.

6. The frequency band extension apparatus according to claim 1, wherein the low frequency sub-band power is further calculated based on one or more low frequency sub-band signals.

7. The frequency band extension apparatus according to claim 1, wherein the feature value calculation unit is further configured to derive the low frequency sub-band power in a predetermined time frame.

8. The frequency band extension apparatus according to claim 1, wherein the input signal is an unencoded sound signal.

9. A frequency band extension method comprising the steps of:

dividing an input signal, having a frequency waveform including frequency components within a predetermined bandwidth, into a plurality of sub-band signals of a plurality of sub-bands within the predetermined bandwidth;

calculating, for each of the plurality of sub-bands, a low frequency sub-band power of the input signal as a feature value;

estimating, for each high frequency sub-band of the plurality of sub-bands, a power of a high frequency sub-band of the input signal based on the feature values to obtain high frequency sub-band power estimation values;

comparing, for each of the high frequency sub-bands, a respective high frequency sub-band power and a respective high-frequency sub-band power estimation value associated with the respective high frequency sub-band; and generating a high-frequency signal of the input signal using, for each of the high frequency sub-bands, a larger result of the comparison of the respective high frequency sub-band power and the respective high-frequency sub-band power estimation value.

10. A non-transitory computer-readable medium having embodied thereon a program, which when executed by a computer causes the computer to execute a method, the method comprising:

dividing an input signal, having a frequency waveform including frequency components within a predetermined bandwidth, into a plurality of sub-band signals of a plurality of sub-bands within the predetermined bandwidth;

calculating, for each of the plurality of sub-bands, a low frequency sub-band power of the input signal as a feature value;

estimating, for each high frequency sub-band of the plurality of sub-bands, a power of a high frequency sub-band of the input signal based on the feature values to obtain high frequency sub-band power estimation values;

comparing, for each of the high frequency sub-bands, a respective high frequency sub-band power and a respective high-frequency sub-band power estimation value associated with the respective high frequency sub-band; and generating a high-frequency signal of the input signal using, for each of the high frequency sub-bands, a larger result of the comparison of the respective high frequency sub-band power and the respective high-frequency sub-band power estimation value.

* * * * *